United States Patent
Darmawaskita et al.

(10) Patent No.: US 6,542,106 B1
(45) Date of Patent: Apr. 1, 2003

(54) COMPARATOR PROGRAMMABLE FOR HIGH-SPEED OR LOW-POWER OPERATION

(75) Inventors: Hartono Darmawaskita, Chandler, AZ (US); Miguel Moreno, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/675,355

(22) Filed: Sep. 29, 2000

(51) Int. Cl.[7] .............................. H03M 1/34; G06F 1/26; G06F 1/28; G06F 1/30
(52) U.S. Cl. ....................................... 341/165; 713/323
(58) Field of Search ................................. 341/144, 156, 341/159, 165, 158, 166; 330/267; 327/77, 51, 63, 544; 711/128; 361/187; 713/323, 340

(56) References Cited

U.S. PATENT DOCUMENTS

| | | | | |
|---|---|---|---|---|
| 4,970,623 A | * | 11/1990 | Pintar ........................ 361/187 |
| 5,019,820 A | * | 5/1991 | Matsuzawa et al. ........ 341/156 |
| 5,347,175 A | * | 9/1994 | Laug et al. .................... 327/77 |
| 5,512,859 A | * | 4/1996 | Moraveji ..................... 330/267 |
| 5,530,384 A | * | 6/1996 | Lee et al. ..................... 327/51 |
| 5,617,572 A | * | 4/1997 | Pearce et al. ............... 713/323 |
| 5,631,583 A | * | 5/1997 | Lee et al. ..................... 327/51 |
| 5,684,486 A | * | 11/1997 | Ono et al. ................... 341/159 |
| 5,778,428 A | * | 7/1998 | Batson et al. ............... 711/128 |

* cited by examiner

Primary Examiner—Patrick Wamsley
(74) Attorney, Agent, or Firm—Baker Botts LLP

(57) ABSTRACT

A comparator is used as a microcontroller peripheral and is programmable for either high-speed or low-power operation. High-speed operation requires higher operating current than the operating current required in the low-power mode, but enables much faster response to changes in input signals. When in the low-power mode, the quiescent current of the comparator circuit is minimal but the response is slower to changing input signals. Current control is used on the first input stage, which affects the current consumption of the subsequent stages. The current consumption is adjusted by switching in and out different current sources for the differential input stage of the comparator.

12 Claims, 6 Drawing Sheets

COMPARATOR PROGRAMMABLE FOR HIGH-SPEED OR LOW-POWER OPERATION

BACKGROUND OF THE INVENTION

The invention relates to integrated circuit microcontrollers, and, more particularly, to an integrated circuit microcontroller having an integral peripheral analog comparator that is programmable for either low-power or high-speed operation.

DESCRIPTION OF THE RELATED TECHNOLOGY

Integrated circuit microcontrollers are becoming far more sophisticated while continuing to drop in price. More and more consumer and commercial products, such as for example but not limited to, appliances, telecommunications devices, automobiles, security systems, full-house instant hot water heaters, thermostats, and the like are being controlled by these integrated circuit microcontrollers. Analog inputs for receiving sensor information and analog outputs for controlling functions are necessary for the application of these microcontrollers. Heretofore separate and discrete analog interfaces were used to connect the digital microcontroller to the outside world.

Analog input devices such as an analog-to-digital converter (ADC), in conjunction with a separate operational amplifier, were used to convert a time-varying analog signal into digital representations thereof for application to digital inputs and use thereof by the microcontroller. Voltage and current levels were also detected by discrete integrated circuit voltage comparators that changed a digital output state when a certain analog value was present on the input of the comparator.

Different applications required different speeds for the ADC-Op Amp and the comparators. This was not a problem since the ADC-OP Amp and the comparators were separate integrated circuit devices that could be selected for the specific applications. Technology has now advanced to the point where the analog input and output devices can be fabricated on the same integrated circuit die that the digital microcontroller and its support logic and memories are also fabricated.

A problem exists, however, in that these analog input microcontrollers must interface with very different analog input parameters such as speed, gain, offset, common mode rejection, linearity and the like. In addition, different applications of the analog input microcontroller may have restrictions on the amount of power available to run the microcontroller and its integral analog peripherals. Since there are so many different combinations of analog input and systems parameters, a great number of different types of integrated circuit analog input microcontrollers are required. This preclude cost reductions because there is no economics of scale through the possibility of increased production quantities.

What is needed is an integrated circuit microcontroller having analog input peripherals that can be used for measurement and control applications requiring different analog input parameters, and can be further mass-produced to reduce overall product costs.

SUMMARY OF THE INVENTION

The invention overcomes the above-identified problems, as well as other shortcomings and deficiencies of existing technologies, by providing, in a single integrated circuit package, a microcontroller system having at least one analog input peripheral device, such as an operational amplifier and/or a voltage comparator, that can be programmed to have specific characteristics and parameters which are adapted for various requirements in the measurement of analog signals of a specific application. In another embodiment of the invention, a plurality of analog input peripheral devices, each having a different characteristic than the others, is programmably selectable for a specific operation with the microcontroller. In still another embodiment, at least one programmable analog comparator is fabricated in an integrated circuit package, and may be configured for an appropriate application of the electronic system of which it is part.

In an embodiment of the programmable comparator of the present invention, the comparator has at least the following two modes: a high-speed mode where power consumption is not an issue, and a low-power mode where speed is not required but conservation of power is desirable, such as when using a battery or other low-power type operation. Selection of either the high-speed or low-power mode is accomplished without using a clocking scheme or logic therefor. Switching between the low-power and high-speed modes may be done dynamically, depending on changing application requirements.

The comparator may be enabled or disabled by setting or clearing, respectively, an input control bit to further save power when it is not in use. The programmable comparator has a first stage that is adapted to have its parameters configured by connection to one of two current sources, or one current source having switchable current modes. The first current source/mode configures the first stage of the comparator for high-speed operation. Subsequent stages of the comparator are affected by the current usage of the first stage; thus, the first current source/mode will determine the speed and power usage of the entire comparator circuit. In similar fashion, the second current source/mode configures the first stage of the comparator for low-power operation. As a result, subsequent stages of the comparator are also configured for low-power operation due to the signal biasing between stages.

A feature of the invention is configuring the operation of an analog comparator for either high-speed or low-power operation.

Another feature is at least one programmable multiple use analog comparator integral with a microcontroller on an integrated circuit die.

Still another feature is at least one programmable multiple-use analog comparator that is integral with a microcontroller in an integrated circuit package.

Another feature is programmably switching the operating mode of an analog comparator that is integral with a microcontroller on an integrated circuit die.

Another feature is at least one programmable multiple-use analog comparator in an integrated circuit package.

An advantage of the present invention is using a microcontroller and a programmable analog comparator fabricated on one integrated circuit die or in a multi-chip package (MCP) for a broad range of applications.

Another advantage is being able to dynamically change the comparator operating parameters as required by the application.

Still another advantage is reducing the number of different comparators and microcontrollers.

Another advantage is eliminating the requirement for a stand-alone comparator with a microcontroller integrated circuit package on a system printed circuit board.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
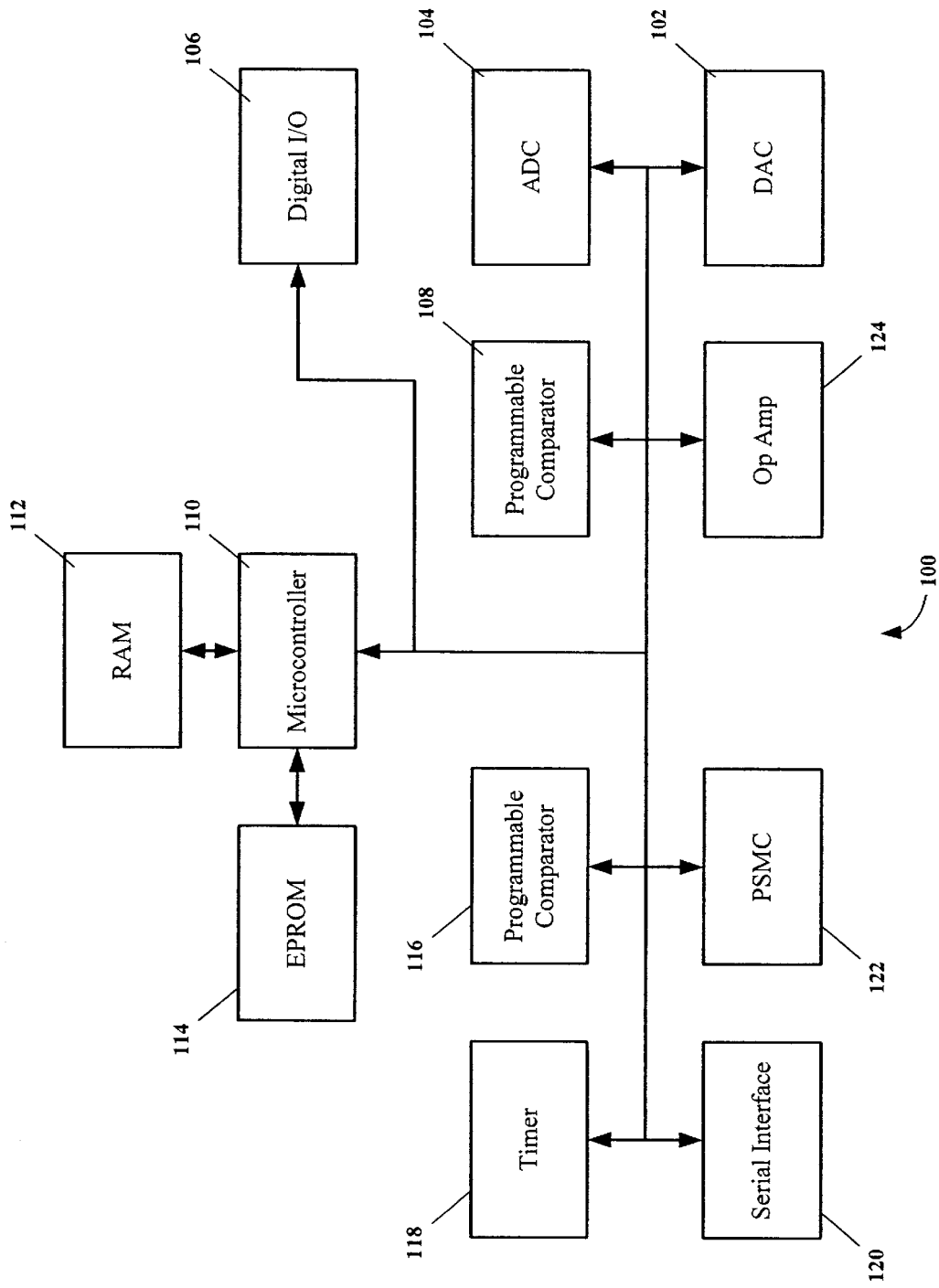
FIG. 1 is a schematic block diagram of a microcontroller system having integral analog and digital peripherals, and input-output functions in a single integrated circuit.

The invention is an analog comparator having programmable parameters such that high-speed or low-power operation may be easily selected. This allows the invention to be used in a more diverse range of applications without having to make different parts for the various applications. The programmable parameter analog comparator is preferably fabricated on the same integrated circuit die as a microcontroller system and, therefore, becomes a very low cost analog peripheral of the microcontroller. According to the invention, a plurality of programmable parameter analog comparators may be used with and preferably fabricated on the same integrated circuit die as the microcontroller system. Selection between high-speed and low-power is accomplished by changing the value of a current source in the first stage of the comparator circuit. Subsequent stages are also affected by the current biasing in the first stage. The current consumption of the programmable comparator is substantially linearly related to the ratio of the current source values used for either the high-speed or low-power modes of operation. High-speed operation necessitates higher power operation. Low-power operation results in slower speed operation of the comparator.

Referring now to the drawings, the details of preferred embodiments of the invention are schematically illustrated. Like elements in the drawings will be represented by like numbers, and similar elements-will be represented by like numbers with a different lower case letter suffix.

Referring to FIG. 1, a schematic block diagram of a microcontroller system having integral analog and digital peripherals and input-output functions in a single integrated circuit is illustrated. The integrated circuit microcontroller system having integral analog and digital peripherals is generally represented by the numeral 100 and comprises a digital-to-analog converter (DAC) 102, an analog-to-digital converter (ADC) 104, a digital input-output (I/O) 106, a plurality of comparators generally represented by numerals 108 and 116, a microcontroller 110, random access memory (RAM) 112, electrically programmable read-only memory (EPROM) 114, a timer 118, a serial interface 120, a programmable switching mode controller (PSMC) 122 and at least one operational amplifier (OP Amp) 124. FIG. 1 is a schematic block diagram that is illustrative of a typical microcontroller system on an integrated circuit die or in an integrated circuit package having at least one integrated circuit die. It is contemplated and is within the scope of the present invention that the microcontroller system 100 may have more or fewer functions than what is illustrated in FIG. 1.

The microcontroller system 100 may be fabricated on one or more integrated circuit dice and enclosed in an integrated circuit package. The integrated circuit package may be, for example, but is not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), T0-220, T0-247, T0-263 and the like.

Figure 2:
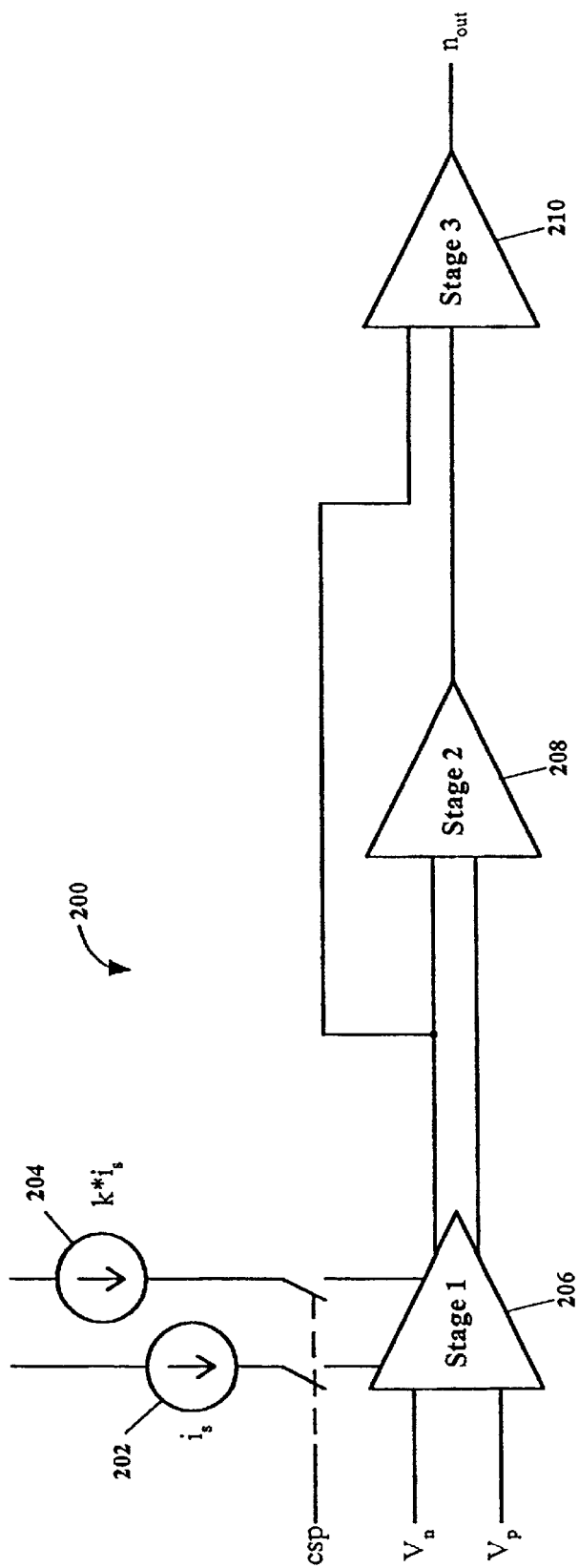
FIG. 2 is a schematic block diagram of a programmable parameter analog comparator according to the present invention.

Referring now to FIG. 2, a schematic block diagram of a programmable parameter analog comparator embodiment of the invention is illustrated. The programmable parameter analog comparator is generally indicated by the numeral 200 and generally comprises a first stage 206, a second stage 208, a third stage 210, a first current source 202, and a second current source 204. The programmable parameter analog comparator 200 has a differential input, $V_p$ and $V_n$, and differential inputs and outputs between the stages 206–210. More or fewer stages may be used for the present invention and are contemplated and within the scope of the invention disclosed herein. The current sources 202 and 204 are switchably connected (csp) to the first stage 206 and determine the operating parameters thereof. For example, the current source 202 may determine low-power operation and the current source 204 may determine high-speed operation of the comparator 200. Biasing, current requirements and speed of operation for the subsequent second and third stages 208 and 210, respectively, are determined by the first stage 206 parameters, which are determined by either the first or second current sources 202 or 204, respectively.

Figure 3:
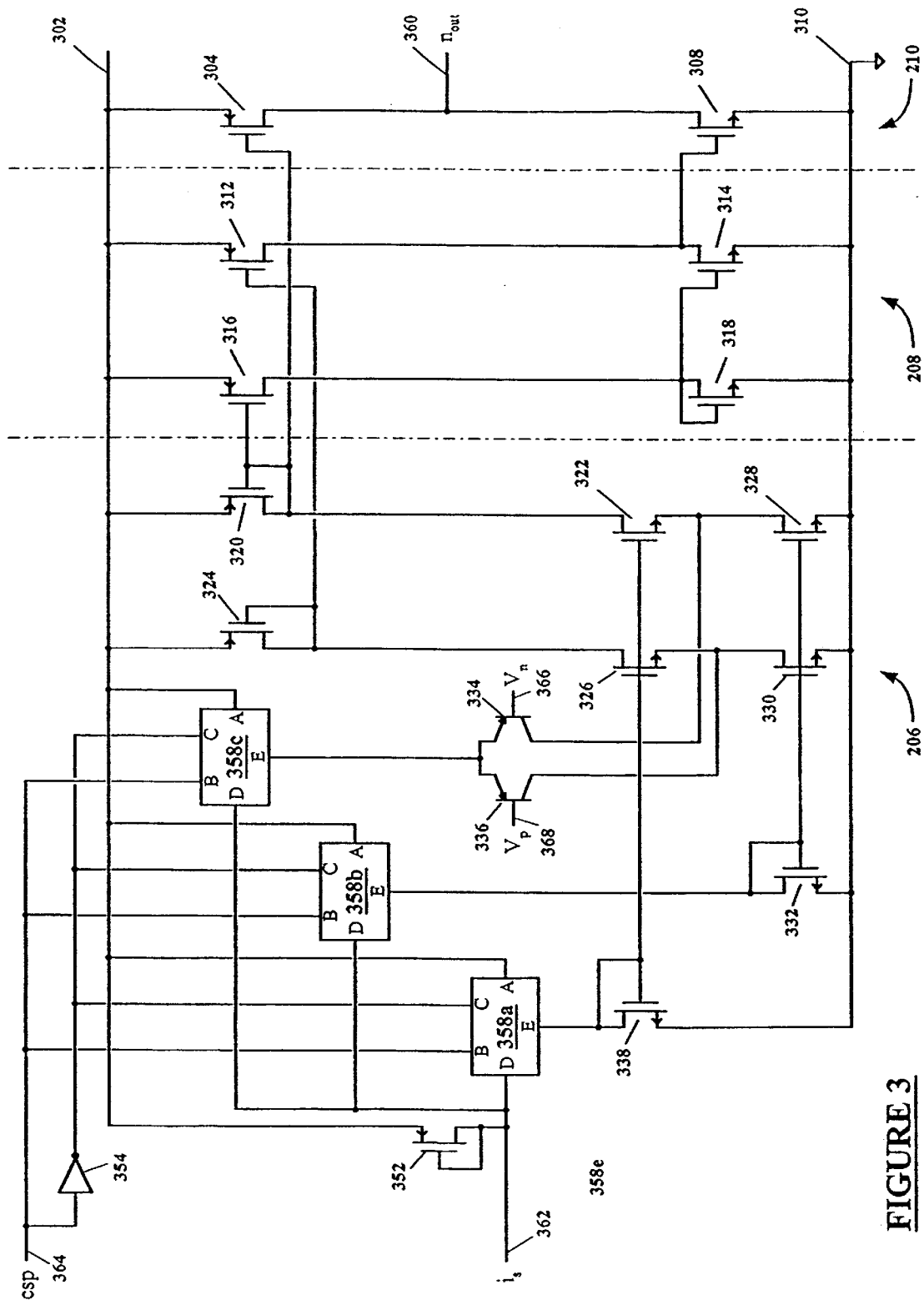
FIG. 3 is a schematic circuit diagram of an embodiment of the programmable parameter analog comparator of FIG. 2.

Referring to FIG. 3, a more detailed schematic circuit diagram of an embodiment of the programmable parameter analog comparator of FIG. 2 is illustrated. The first stage 206 comprises a PNP differential input stage and current control logic circuits (358a–358c). PNP transistors 334 and 336 are used to reduce the input offset voltage due to device mismatch in the fabrication process. The PNP transistors may be, for example, but are not limited to, lateral PNP. Other types of transistors may be used, such as P-channel CMOS and the like. The first stage 206 also provides isolation of the inputs 366 and 368 from the fast switching output signals, thus reducing noise coupling between the output and input. The amount of current used by the programmable parameter analog comparator is controlled by programmable current sources 358a–358c which bias transistors 334, 336, 322, 326, 328 and 330 of the cascode structure of the first stage 206.

Figure 3A:
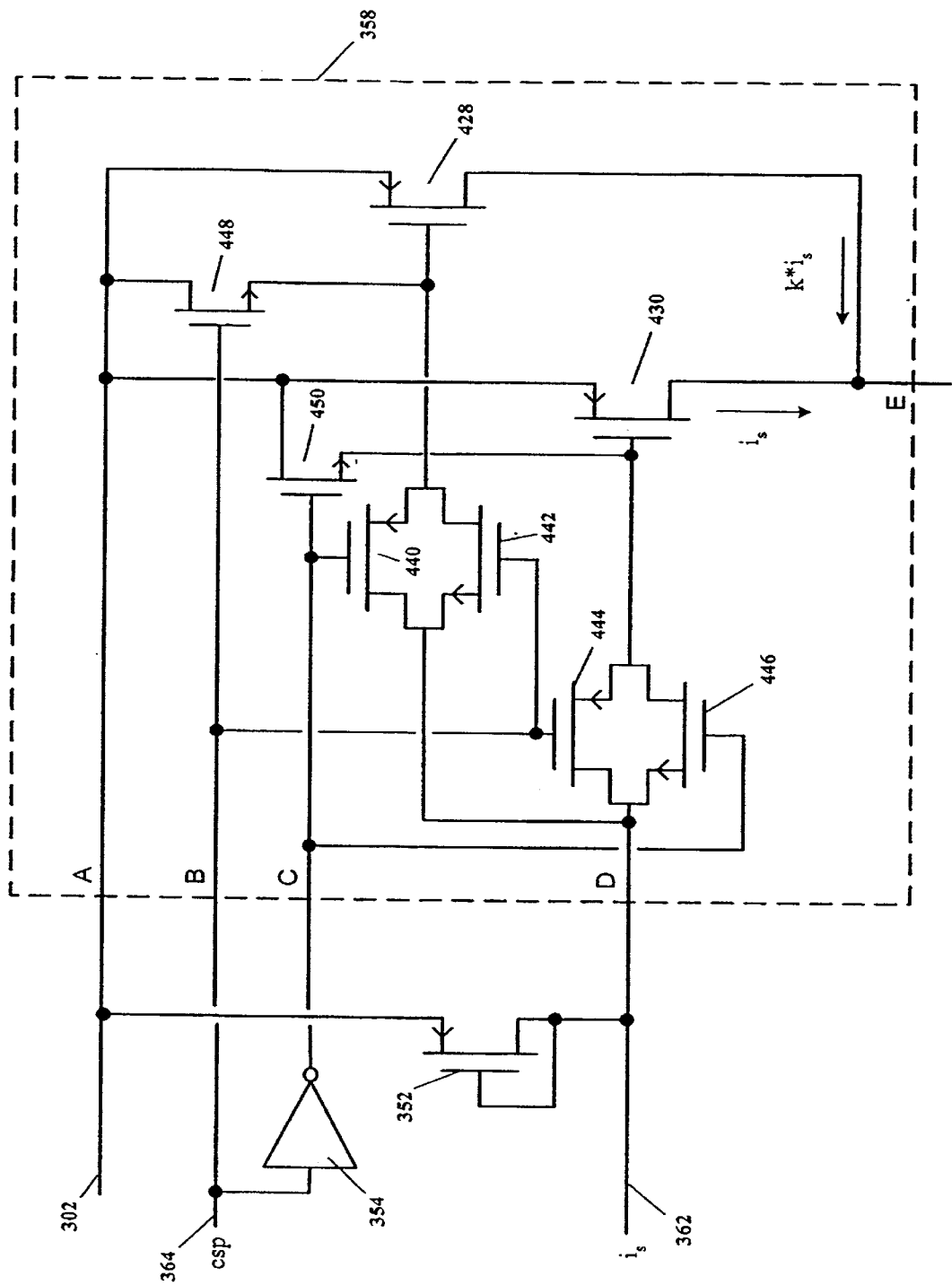
FIG. 3A is a more detailed schematic circuit diagram of the programmable current source portion of the circuit of FIG. 3.

Referring to FIG. 3A, a more detailed schematic circuit diagram representative of the programmable current sources 358a, 358b and 358c is illustrated. A programmable current source, according to the present invention, generally illustrated by the numeral 358, comprises a high-speed current source transistor 428, a low-power current source transistor 430, transistor switch pair 440 and 442, and transistor switch pair 444 and 446. Node 364 is connected to the input of inverter 354, the gate of transistor 442 and the gate of transistor 444, and the output of the inverter 354 is applied to the gates of transistors 440 and 446. When a logic "1" is applied to node 364, the high-speed current source transistor 428 supplies k*$i_s$ current to node E. When a logic "0" is applied to node 364, the low-power current source transistor 430 supplies $i_s$ current to node E. Current value $i_s$ is supplied at node 362. Transistor 448 shorts the transistor 428 source and gate together, thereby disabling transistor 428 when in the low power mode. Transistor 450 shorts the transistor 430 source and gate together, thereby disabling transistor 430 when in the high speed mode.

Referring back to FIG. 3, the programmable current source 358c provides current for the differential input stage (transistors 334 and 336), the programmable current source 358b provides current for the transistors 328 and 330, and the programmable current source 358a provides current for the transistors 322 and 326. When a logic "0" is applied to node 364, the current sources 358a–358c provide current of a value $i_s$ for low-power operation, and when a logic "1" is applied to node 364, the current sources 358a–358c provide current of a value k*$i_s$ for high speed operation.

The current consumption of each successive amplification stage (208 and 210) is set by the current in the first stage 206 due to the signal biasing of the circuit design illustrated in FIG. 3. Therefore, current control devices are not required in the stages 208 and 210.

As an example of a preferred embodiment of the present invention, the drain current through transistors 312 and 316 may be approximately calculated by:

$$I316=I320*(W316/L316)*(W320/L320)$$

$$I312=I324*(W312/L312)*(W324/L324)$$

Where:
W312=channel width of transistor 312;
L312=channel length of transistor 312;
W316=channel width of transistor 316;
L316=channel length of transistor 316;
W320=channel width of transistor 320;
L320=channel length of transistor 320;
W324=channel width of transistor 324;
L324=channel length of transistor 324;
I320=drain current through transistor 320; and
I324=drain current through transistor 324.

Neglecting channel length modulation effects and transistor mismatches, the current through the third stage 210 is determined by the width/length ratio of transistor 304 to transistor 324. Thus, the overall current consumption of the programmable parameter comparator 200 of the present invention from the high-speed (power) mode to the low-power mode is substantially linearly proportional to the ratio of the currents k=I of transistor 438 divided by I of transistor 430.

Modifying the current in each of the stages 206, 208 and 210 affects the propagation delay through the comparator 200 circuit. When low-propagation delay (high-speed mode) is required, the higher current source is switched in. This results in the first stage 206 responding quickly to a change between the inputs 366 and 368 due to the low impedance of the first stage 206 load transistors 320–330, but it may not provide sufficient gain to resolve very small voltage differences at the inputs 366 and 368. The second stage 208 and the third stage 210 are high gain but are slower in response time than the first stage 206. However, the bias signals from the first stage 206 to the subsequent stages 208 and 210 are opposite in polarity, so during a comparator stage change, the speed of operation through the stages 208 and 210 is thereby improved. Thus, high-speed and high gain are achieved with the circuit embodiment illustrated in FIG. 3.

In the low current mode, propagation delay is not so critical, but high gain is still required to detect small voltage differences between the inputs 366 and 368. The first stage 206 decreases in gain with reduced current, but the second stage 208 and the third stage 210 will increase in gain with a reduction in current so as to maintain the overall gain of the comparator 200.

It is contemplated and within the scope of the present invention that the circuit illustrated in FIG. 3 also will effectively operate at low supply voltage. During normal operation, the second stage 208 and the third stage 210 determine the minimum voltage supply requirements. The second stage 208 and the third stage 210 preferably operate at a bias voltage a few hundred millivolts above the threshold voltage of the complementary metal oxide semiconductor (CMOS) transistors plus a minimum saturation voltage equivalent to a few hundred millivolts.

Power is applied at node 302, ground is applied at node 310, high-speed—low-power selection is made through node 364, current injection is applied to node 362, the comparator inputs are at nodes 366 and 368 and the comparator output is at node 360.

Figure 4:
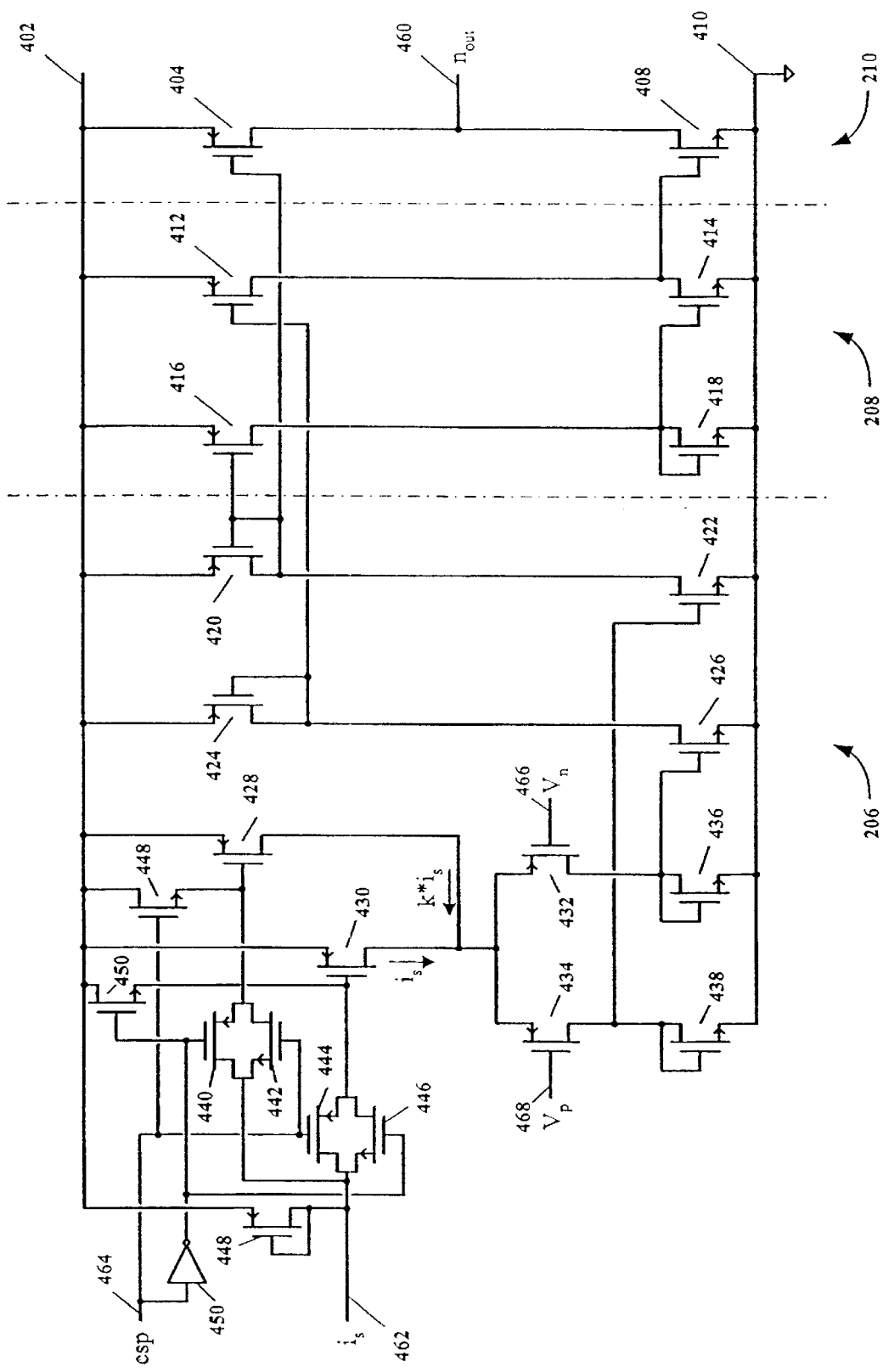
FIG. 4 is a schematic circuit diagram of another embodiment of the programmable parameter analog comparator of FIG. 2.

Referring to FIG. 4, a more detailed schematic circuit diagram of another embodiment of the programmable parameter analog comparator of FIG. 2 is illustrated. The first stage 206 comprises a differential input stage and current control logic circuits. Current consumption is adjusted by switching in and out current sources 430 and 428, as illustrated in FIG. 3A and the description thereof. The first stage 206 also provides isolation of the inputs 466 and 468, from the fast switching output signals, thus reducing noise coupling between the output and input. The current source 430 provides current for the differential input stage (transistors 432 and 434) during the low-power mode, and current source 428 provides current for the differential input stage (transistors 432 and 434) during the high-speed (power) mode. The current source 428 is sized so as to provide a factor, k, more current during high-speed operation than during low-power operation. The current consumption of each successive amplification stage (208 and 210) is set by the current in the first stage 206 due to the signal biasing of the circuit design illustrated in FIG. 4. Therefore, current control devices are not required in the stages 208 and 210.

As an example of a preferred embodiment of the present invention, the drain current through transistors 422 and 426 of the first stage 206 may be approximately calculated by:

$$I422=I438*(W422/L422)*(W438/L438)$$

$$I426=I436*(W426/L426)*(W436/L436)$$

Where:
W422=channel width of transistor 422;
L422=channel length of transistor 422;
W426=channel width of transistor 426;
L426=channel length of transistor 426;

W436=channel width of transistor 436;
L436=channel length of transistor 436;
W438=channel width of transistor 438;
L438=channel length of transistor 438;
I436=drain current through transistor 436; and
I438=drain current through transistor 438.

Neglecting channel length modulation effects and transistor mismatches, the current through the second stage 208 is determined by the width/length ratios of transistor 412 to transistor 424, and transistor 416 to transistor 420, which are set by I426 and I422, respectively. The current through the third stage 210 is determined by the width/length ratio of transistor 404 to transistor 424. Thus, the overall current consumption of the programmable parameter comparator 200 of the present invention from the high-speed (power) mode to the low-power mode is substantially linearly proportional to the ratio of the currents k=I428/I430.

Modifying the current in each of the stages 206, 208 and 210 affects the propagation delay through the comparator 200 circuit. When low propagation delay (high-speed mode) is required, the higher current source is switched in. This results in the first stage 206 responding quickly to a change between the inputs 466 and 468 due to the low impedance of the first stage 206 load transistors 438, 436, 422, 426, 420 and 424, but it may not provide sufficient gain to resolve very small voltage differences at the inputs 466 and 468. The second stage 208 and the third stage 210 are high gain but are slower in response time than the first stage 206. However, the bias signals from the first stage 206 to the subsequent stages 208 and 210 are opposite in polarity so during a comparator stage change, the speed of operation through the stages 208 and 210 are thereby improved. Thus, high-speed and high gain are achieved with the circuit embodiment illustrated in FIG. 4.

In the low current mode, propagation delay is not as critical, but high gain is still required to detect small voltage differences between the inputs 466 and 468. The first stage 206 decreases in gain with reduced current, but the second stage 208 and the third stage 210 will increase in gain with a reduction in current so as to maintain the overall gain of the comparator 200.

It is contemplated and within the scope of the present invention that the circuit illustrated in FIG. 4 also will effectively operate at low supply voltage. During normal operation, the first stage 206 determines the minimum voltage supply requirements. The first stage 206 preferably operates at a bias voltage a few hundred millivolts above the threshold voltage of the complementary metal oxide semiconductor (CMOS) transistors plus about two minimum saturation voltages equivalent to a few hundred millivolts.

Power is applied at node 402, ground is applied at node 410, high-speed—low-power selection is made through node 464, current injection is applied to node 462, the comparator inputs are at nodes 466 and 468, and the comparator output is at node 460.

Figure 5:
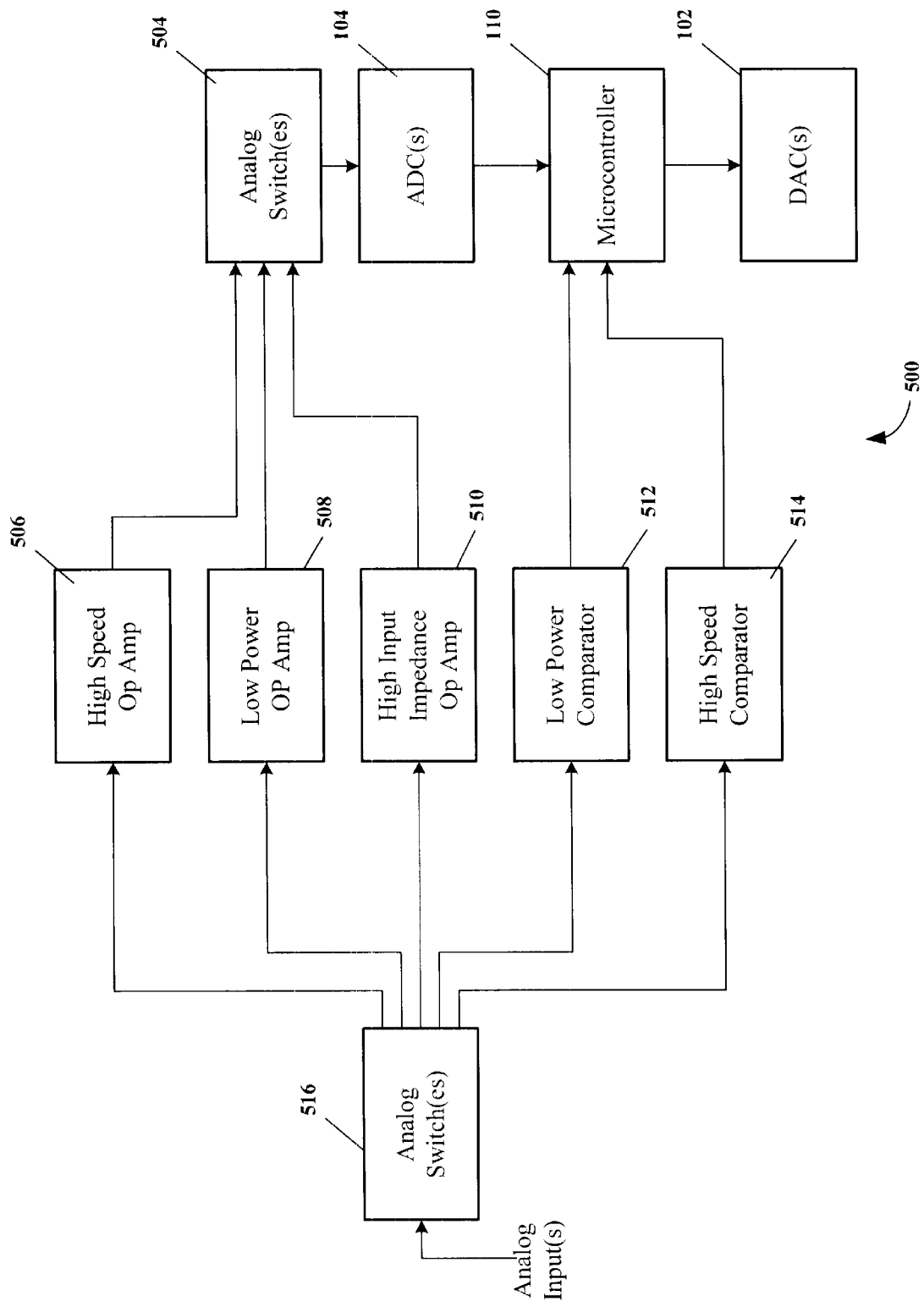
FIG. 5 is a schematic block diagram of a microcontroller system having a plurality of switchable analog peripherals in a single integrated circuit, according to another embodiment of the invention.

Referring to FIG. 5, a schematic block diagram of a microcontroller system having a plurality of switchable analog peripherals in a single integrated circuit is illustrated. This integrated circuit microcontroller system is generally represented by the numeral 500 and comprises a microcontroller 110, an analog-to-digital converter (ADC) 104, a high-speed operational amplifier (Op Amp) 506, a low-power Op Amp 508, a high input impedance Op Amp 510, a low-power comparator 512, a high-speed comparator 514, an input select analog switch 516, and an output select analog switch 504. Also contemplated for the embodiment illustrated in FIG. 5 are functions illustrated in FIG. 1, such as, for example, but are not limited to, the digital-to-analog converter (DAC) 102, digital input-output (I/O) 106, random access memory (RAM) 112, electrically programmable read only memory (EPROM) 114, a timer 118, a serial interface 120 and a programmable switching mode controller (PSMC) 122. In addition, a sleep mode function (not illustrated) is contemplated and incorporated herein for powering down, disabling, putting in a sleep mode, and the like, the analog peripherals that are not selected so as to reduce power consumption of the microcontroller integrated circuit. FIG. 5 is a schematic block diagram that is illustrative of a typical microcontroller system on an integrated circuit die or in an integrated circuit package having at least one integrated circuit die. It is contemplated and within the scope of the present invention that the microcontroller system 500 may have more or fewer functions than what is illustrated in FIG. 5.

The analog switch 516 connects the input(s) of one or more of the selected analog peripherals (high-speed Op Amp 506, low-power Op Amp 508, high input impedance Op Amp 510, low-power comparator 512, or high-speed comparator 514) to an analog input of the microcontroller system 500 integrated circuit package (not illustrated). The other analog switch 504 connects the output of one or more of the selected analog peripherals (for Op Amps 506–510 only) to the ADC 104, which converts the analog signal to a digital representation for processing by the microcontroller 110. The low-power comparator 512 and high-speed comparator 514 have digital outputs that may be connected directly to digital inputs of the microcontroller 110, or they may be multiplexed through a digital multiplexer (not illustrated) to the microcontroller 110. In addition, the unselected analog peripherals may be shut down or put in a sleep mode to conserve power.

Depending upon the application in which the microcontroller system 500 is required to operate, the appropriate analog peripherals may be programmably selected. More than one ADC 104, switch 516 and switch 504 may be used with the embodiment of the invention illustrated in FIG. 5. In addition, a DAC 102 may be connected to the microcontroller 110 for outputting analog control signals.

The invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. An integrated circuit microcontroller and analog peripheral, comprising:

a microcontroller and at least one analog peripheral in an integrated circuit;

said at least one analog peripheral having programmable operating parameters controlled by said microcontroller, wherein the programmable operating parameters include a high-speed and a low-power mode of operation for said at least one analog peripheral;

said at least one analog peripheral having a first current source for supplying a first current value for continuously operating said at least one analog peripheral in the high-speed mode and a second current source for supplying a second current value for continuously operating said at least one analog peripheral in the low-power mode.

2. The integrated circuit of claim 1, wherein said at least one analog peripheral comprises a plurality of amplifier stages.

3. The integrated circuit of claim 2, wherein the first current source is coupled to a first amplifier stage of the plurality of amplifier stages for selecting the high speed mode of operation and the second current source is coupled to the first amplifier stage for selecting the low power mode of operation.

4. The integrated circuit of claim 3, wherein coupling the first or second current sources to the first amplifier stage also affects the other stages of the plurality of amplifier stages.

5. The integrated circuit of claim 1, wherein said at least one analog peripheral has a first amplifier stage having differential analog input.

6. The integrated circuit of claim 5, wherein the first amplifier stage has a lateral PNP differential input.

7. The integrated circuit of claim 1, wherein said at least one analog peripheral is a voltage comparator having a first and a second analog input.

8. The integrated circuit of claim 1, wherein the first and second current sources are switchably coupled to said at least one analog peripheral.

9. An integrated circuit analog voltage comparator having programmable operating parameters, comprising:

an analog amplifier configured for operation as a voltage comparator;

a first current source switchably connected to said amplifier and supplying a first current value for continuously operating said amplifier in a high-speed mode; and a second current source switchably connected to said amplifier and supplying a second current value for continuously operating said amplifier in a low-power mode, wherein said amplifier, said first current source and said second current source are fabricated on an integrated circuit.

10. The integrated circuit analog voltage comparator of claim 9, wherein said analog amplifier comprises a plurality of amplifier stages.

11. The integrated circuit analog voltage comparator of claim 10, wherein the first and second current sources are switchably connected to a first amplifier stage of the plurality of amplifier stages.

12. The integrated circuit analog voltage comparator of claim 11, wherein said analog amplifier is adapted for a differential analog voltage input, and has a digital output having a first logic level state and a second logic level state depending upon a difference value of voltages on the differential analog voltage input.

* * * * *